United States Patent [19]

Kidger

[11] Patent Number: 4,918,397
[45] Date of Patent: Apr. 17, 1990

[54] GAIN CONTROL CIRCUIT
[75] Inventor: Alexander C. Kidger, Coventry, England
[73] Assignee: GEC Plessey Telecommunications Limited, England
[21] Appl. No.: 297,688
[22] Filed: Jan. 17, 1989
[30] Foreign Application Priority Data
Jan. 27, 1988 [GB] United Kingdom ............... 8801750
[51] Int. Cl.⁴ .............................................. H03G 3/00
[52] U.S. Cl. ...................................... 330/86; 330/282
[58] Field of Search ................................. 330/86, 282
[56] References Cited
U.S. PATENT DOCUMENTS

| | | | |
|---|---|---|---|
| 3,355,670 | 1/1967 | Pastoriza | 330/86 UX |
| 3,500,316 | 3/1970 | Brown | 330/282 X |
| 4,451,779 | 5/1984 | Griep | 330/86 X |
| 4,628,276 | 12/1986 | Mizutani | 330/282 X |

OTHER PUBLICATIONS

Vrba, "Highly Stable Circuits Based on Operational Amplifiers with an Electronic Switch at the Output", Radio Electron. & Commun. Sys., vol. 23, No. 8, 1980, pp. 38–43.
Intersil AD7523, "8-Bit Multiplying D/A Converter", pp. 6–7, 6–9, published by Integrated Circuit Manufacturers.
Digital-To-Analog Converters, "8-Bit Buffered Multiplying DAC", AD7524, vol. 1,9, pp. 171, 173, 175.

Primary Examiner—James B. Mullins
Attorney, Agent, or Firm—Kirschstein, Ottinger, Israel & Schiffmiller

[57] ABSTRACT

A gain control circuit includes a network (112) for splitting a first signal into first and second signal paths with the ratio of the values of the signals in the respective first and second paths being determined in operation by a digital control signal. The circuit includes an input stage (101) the output of which is connected to the input of network (102) so as to provide said first signal, said input stage (101) having a gain which is set by the value of the signal in said first signal path, and an output stage (104) the output of which is controlled by the signal in said second signal path.

5 Claims, 2 Drawing Sheets

GAIN CONTROL CIRCUIT

BACKGROUND OF THE INVENTION

1. Field of the Invention

The present invention concerns circuits for use in gain control. The gain control of signals is used in many applications and one field of use is in controlling amplification or attenuation in the line cards in a telephone exchange. In particular the gain control circuit with which the present invention is concerned enables the value of attenuation or amplification to be controlled by digital values.

2. Description of Related Art

One currently used type of gain control circuit which will be described in greater detail hereinafter utilises a network of resistors arranged in what is known as the R-2R- ladder principle in combination with an operational amplifier. In this known circuit an input current is split by the resistor network into two paths which are held at 0 volts. The ratio of current in the two paths is dependent on the way in which the network is switched.

This known system has problems in providing adequate range combined with adequate resolution. Effectively good resolution can be obtained over a limited range, but any attempt to increase the range leads to unacceptable loss of resolution.

SUMMARY OF THE INVENTION

The present invention has for an object to provide a digitally controlled gain control circuit which can provide adequate resolution over a greater range than the above mentioned known system.

According to the present invention a gain control circuit comprises a network for splitting a first signal into first and second signal paths in a ratio dependent on the value of a digital control signal, an input stage to which an input signal can be applied and the output of which stage provides said first signal, said input stage having a gain which is set by the value of the signal in said first signal path, and an output stage the output level of which is controlled by the signal in the second signal path.

In accordance with a feature of the invention, the network may be a resistive network. Preferably the resistive network is of the type known as an R-2R- network.

In accordance with another feature of the invention the input stage may comprise an operational amplifier, the signal in said first signal path being connected to the negative input of the operational amplifier, and the output of the operational amplifier providing said first signal.

In accordance with a still further feature of the invention the output stage may comprise an operational amplifier the, signal in said second path being applied to the negative input of the operational amplifier the output of which is connected in a feedback loop to the negative input and is also the output signal of the gain control circuit.

BRIEF DESCRIPTION OF THE DRAWINGS

In order that the present invention may be more readily understood, an embodiment thereof will now be described by way of example and with reference to the accompanying drawings, in which.

DETAILED DESCRIPTION OF THE PREFERRED EMBODIMENTS

Figure 1:
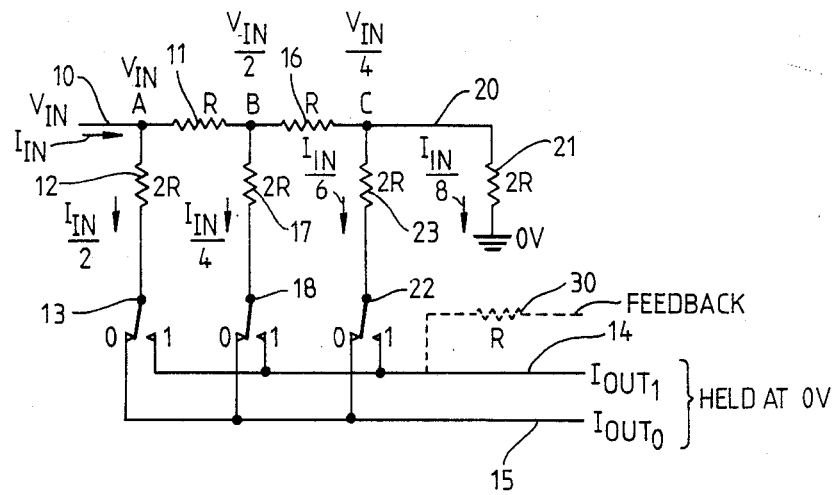
FIG. 1 is a diagram of a R-2R- Ladder network according to the Prior Art.

Referring now to FIG. 1 of the drawings this shows a digital-to-analogue converter working on the R-2R-Ladder principle. A voltage $V_{IN}$ is applied at an input 10 and the resulting current is divided at point A into two arms, one containing a resistor 11 of resistance R and the other a resistor 12 of resistance 2R. A switch 13 connects resistor 12 to one of two output lines 14, 15 which are both held at 0 volts. The path from resistor 11 is again split at point B, into two arms. As before one arm has a resistor 16 of value R and the other a resistor 17 of value 2R. A switch 18 is capable of connecting the output of resistor 17 to either of lines 14, 15. The network continues in similar fashion at point C but in this embodiment the line 20 carrying the serial resistors 11, 16 is terminated in a resistor 21 of value 2R which is earthed. A switch 22 can connect 2R resistor 23 to either of lines 14, 15. The switches are digital switches controlled, in this embodiment, by a three bit digital word. The word causes the input current $I_{IN}$ to be divided between the two output lines 14, 15 in proportion to the word's value. In the present embodiment $$I_{OUT1} \text{ (See FIG. 1)} = I_{IN \frac{n}{8}}$$

$$I_{OUT0} = I_{IN \frac{7-n}{8}} \text{ where } n = \text{the digital input.}$$

Figure 2:
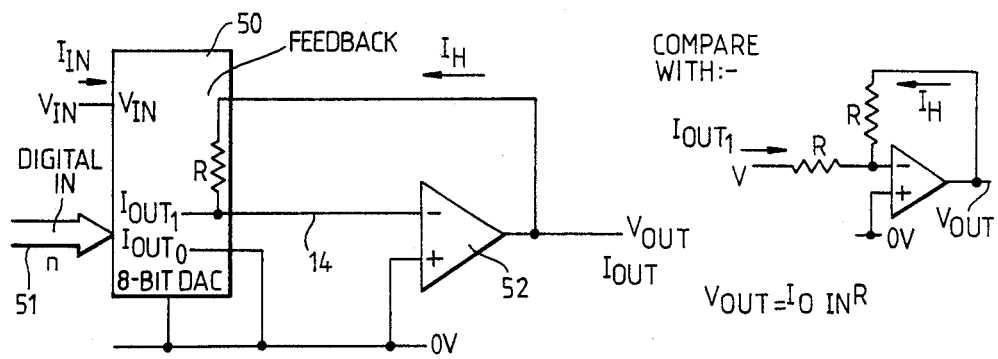
FIG. 2 is a block diagram of a known digital attenuator circuit according to the Prior Art.

The resistor 30 shown in dotted lines in FIG. 1 has the value R and is part of an actual digital attenuation control circuit shown in FIG. 2. In operation it is usual to allow $V_{IN}$ to be any reasonable analogue signal, including an A.C. signal such that the output is a fraction of the A.C. input.

Referring now to FIG. 2 of the drawing the R-2R-network shown in FIG. 1 is generally indicated at 50 with the digital control signal input at 51. Line 14, carrying $I_{OUT1}$ is connected to the negative input of an operational amplifier 52. In this embodiment the circuit 50 is an 8-bit digital-to-analogue converter so that $$I_{OUT1} = I_{IN \frac{n}{256}}$$

$$I_{OUT0} = I_{IN \frac{255-n}{256}} \text{ where } n \text{ is the digital input.}$$

With the circuit shown in FIG. 2 it can be seen that the output $V_{OUT}$ of the operational amplifier 52 will swing so that $$I_{FB} = -I_{OUT1}$$

Thus $I_{FB} = -I_{OUT1} = -I_{IN \frac{n}{256}}$

-continued $$\text{and } \frac{V_{OUT}}{R} = -I_{OUT1} = \frac{-V_{IN}}{R} \frac{n}{256}$$

Therefore $V_{OUT} = (-)V_{IN} \frac{n}{256}$

This is the basis of the circuit's operation as a digitally controlled attenuator.

Figure 3:
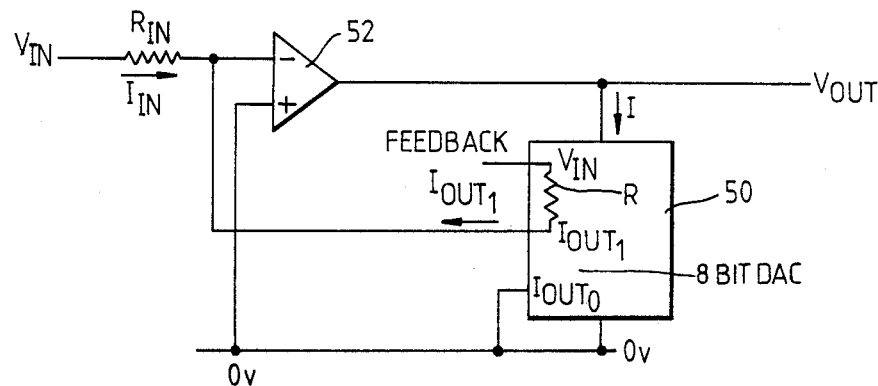
FIG. 3 is a similar diagram to FIG. 2 but showing a known digital gain control circuit according to the Prior Art.

FIG. 3 shows a corresponding circuit for digitally controlled gain. In this figure integers common with FIG. 2 have been given the same reference numerals. With this circuit it can be seen that $I_{OUT1}$ goes to a virtual earth and that $$I_{IN} = -I_{OUT1} = I \frac{n}{256}$$

$$\frac{V_{IN}}{R_{IN}} = \frac{-V_{OUT}}{R} \frac{n}{256}$$

$$V_{OUT} = -V_{IN} \frac{R}{R_{IN}} \frac{256}{n}$$

With $R_{IN}$ chosen to equal R which is the basic resistive unit of the network in circuit 50, then $$V_{OUT} = -V_{IN} \frac{256}{n}$$

It will now be appreciated that for both attenuation and amplification a passive attenuator can be cascaded with a digitally controlled gain stage or vice versa with a digitally controlled attenuator and a fixed gain stage.

For example a 20 dB attenuator coupled with a digitally controlled gain stage of the kind just described of 0–40dB will give digital control over −20 dB to +20 dB. However if the maximum difference between gain steps should be 0.5 dB a problem arises. In fact, calculations show that the dynamic range for a maximum 0.5 dB step is about 23 dB. This range is insufficient.

Figure 4:
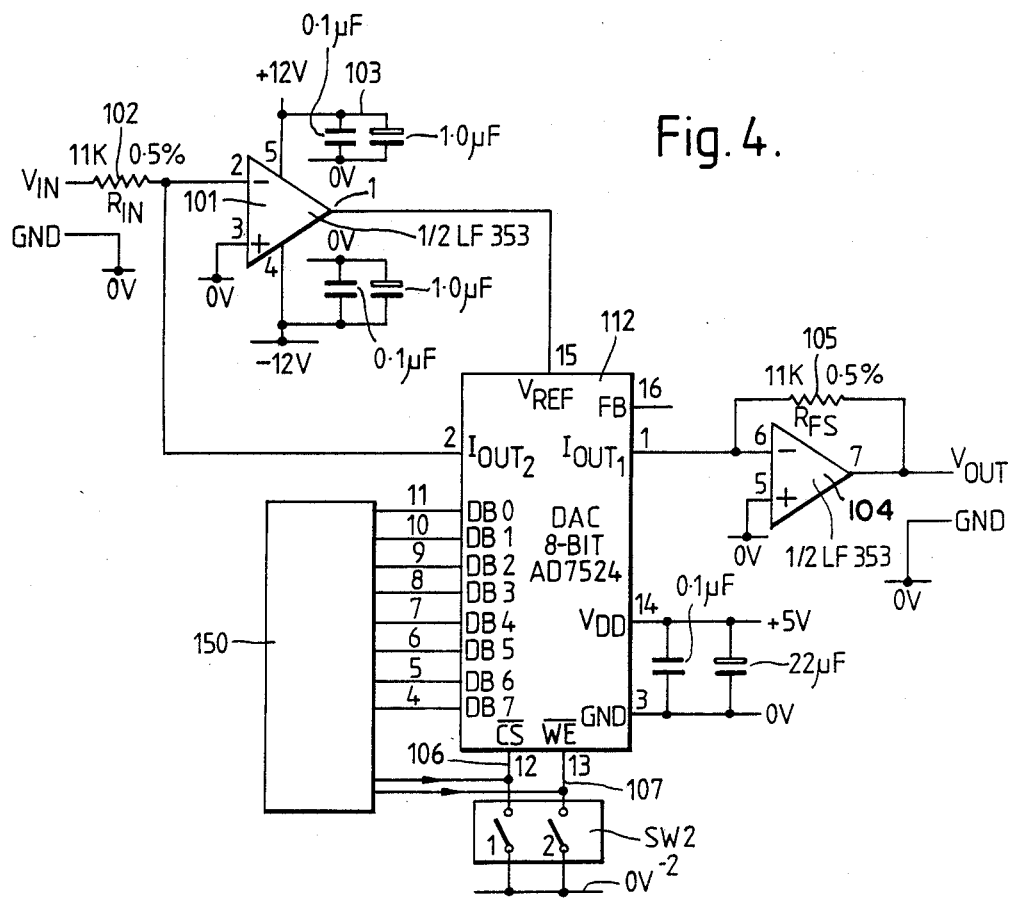
FIG. 4 is a similar diagram of a digital control circuit according to the present invention.

Referring now to FIG. 4 of the drawings this shows a gain control circuit according to the present invention. This circuit has three basic stages. The first of these is an input stage comprising an operational amplifier 101. The signal the level of which is to be controlled is supplied via a resistor 102 to the negative input of amplifier 101 the positive input of which is earthed. The output of amplifier 101 is connected to the input of a resistive network 112 similar to that already described with reference to FIG. 1. Network 112 is controlled by an 8-bit digital signal generated by switches or by any suitable computer-based controller so as to be capable, as previously described, of dividing the input signal $V_{IN}$ into two signal paths in a ratio dependent on the value of the digital control signal. The second of these paths is indicated at $I_{OUT2}$ and is supplied to the negative input of operational amplifier 101 as a feedback signal. Amplifier 101 has associated capacitors 103 which act to decouple the supply so as to give a stable supply standard.

The resistive network 112 is the second of the three stages and the second signal path $I_{OUT1}$ is connected to the negative input of an operational amplifier 104 which provides the third of the three stages. The positive input of amplifier 104 is earthed and its output $V_{OUT}$ is the output signal of the gain control circuit and is taken via a resistor 105 back to its negative input as a feedback loop. This amplifier also has decoupling capacitor.

The resistive network 112, in this particular embodiment, is a integrated circuit sold by Analog Devices under the reference AD7524 or Texas Instruments under the reference TLC7524. The chip has two control inputs in the form of a chip select input 106 and a chip write input 107. These are also controlled by the computer-based controller already mentioned and not shown. Input 106 selects the chip and input 107 enables a data change.

It can be seen that in this circuit stage 101 gives a gain dependent on the value of the 8-bit input signal in response to variations in $I_{OUT2}$, whilst stage 104 has a fixed gain but acts on $I_{OUT1}$ which is also varied as a result of the 8-bit digital control signal. Thus unlike the known circuit arrangements already described both of the signal paths generated by the network 112 are utilised in arriving at the final signal output.

By calculation similar to those carried out in respect of the known arrangements it can be shown that for the circuit of FIG. 4

$$\frac{V_{OUT}}{V_{IN}} = \frac{n}{255 - n} \text{ where } n = \text{the digital input}$$

Accordingly the embodiment described is capable of giving a dynamic range of 43 to 44 db whilst still retaining acceptable resolution.

I claim:

1. A gain control circuit for controlling the gain of an input signal, the circuit comprising:
   (a) input stage means, including a first operational amplifier having two inputs, and operative for receiving, at one of the inputs, said input signal, the gain of which is to be controlled, said first amplifier having an output from which an output signal is conducted;
   (b) R-2R-resistive network means connected to the output of said first amplifier, and operative for splitting the output signal of the first amplifier into respective first and second signals conducted along first and second signal paths, said second path being connected to said one input of the first amplifier to which said input signal was conducted;
   (c) digital control means connected to the resistive network means, and operative for controlling the ratio of the first and second signals in the respective first and second signal paths; and
   (d) output stage means, including a second operational amplifier having two inputs, one of which is connected to the first signal path, and an output from which a gain control output signal is conducted.

2. The gain control circuit according to claim 1, wherein said one input of the first operational amplifier is a negative input.

3. The gain control circuit according to claim 1, wherein said one input of the second operational amplifier is a negative input.

4. The gain control circuit according to claim 1, wherein the digital control means controls the ratio of the first and second signals as a function of a digital control signal.

5. The gain control circuit according to claim 4, wherein the gain of the input signal is a function of the digital control signal.

* * * * *